(12) United States Patent
Khorram et al.

(10) Patent No.: US 7,129,803 B2
(45) Date of Patent: Oct. 31, 2006

(54) TUNED TRANSFORMER BALUN CIRCUIT AND APPLICATIONS THEREOF

(75) Inventors: Shahla Khorram, Irvine, CA (US); Qiang Li, Irvine, CA (US); Jesus Alfonso Castaneda, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 54 days.

(21) Appl. No.: 10/802,015

(22) Filed: Mar. 16, 2004

(65) Prior Publication Data

US 2005/0206471 A1 Sep. 22, 2005

(51) Int. Cl.
*H03H 7/42* (2006.01)
*H03H 11/28* (2006.01)

(52) U.S. Cl. .......................... 333/25; 333/177

(58) Field of Classification Search ................ 333/25, 333/26, 32, 33, 177; 330/301
See application file for complete search history.

(56) References Cited

U.S. PATENT DOCUMENTS 5,644,272 A * 7/1997 Dabrowski ................. 333/26
6,654,595 B1 * 11/2003 Dexter ....................... 455/323
6,809,581 B1 * 10/2004 Rofougaran et al. ........ 327/563

* cited by examiner

*Primary Examiner*—Dean Takaoka
(74) *Attorney, Agent, or Firm*—Garlick Harrison & Markison; Bruce E. Stuckman

(57) ABSTRACT

A tuned transformer balun circuit includes a transformer balun, a first tuning capacitor, a second tuning capacitor, and a third tuning capacitor. A first plate of the first tuning capacitor is operably coupled to a first node of the differential winding and a second plate of the first tuning capacitor is operably coupled to a circuit ground. A first plate of the tuning capacitor is operably coupled to a second node of the differential winding and a second plate of the second tuning capacitor is operably coupled to the circuit ground. A first plate of the third tuning capacitor is operably coupled to a first node of the single-end winding and the second plate of the third tuning capacitor is operably coupled to transceiver radio frequency signals, wherein, based on loading of the single-ended winding and the differential winding, the first, second, and third tuning capacitors resonate with the transformer balun to provide efficient energy transfer from the transmitter section to the antenna.

8 Claims, 4 Drawing Sheets tuned transformer balun circuit 85 tuned transformer balun
circuit 85 tuned transformer balun circuit 85

TUNED TRANSFORMER BALUN CIRCUIT AND APPLICATIONS THEREOF

BACKGROUND OF THE INVENTION

1. Technical Field of the Invention

This invention relates generally to wireless communication devices and more particularly to radio interfaces of such wireless communication devices.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

In many wireless applications, a radio transceiver includes one antenna that is shared by the receiver section and the transmitter section. The sharing of the antenna may be achieved by a transmit/receive switch or a transformer balun. In recent advances in the wireless communication art, a transformer balun has been implemented on-chip with the receiver section and the transmitter section. In such an implementation, a single-ended winding of the transformer balun is operably coupled to the antenna, a first differential winding of the transformer balun is operably coupled to the receiver section, and another differential winding of the transformer balun is operably coupled to the transmitter section.

While the benefits of using an on-chip balun are many, there are some issues of concern, which include impedance matching of the loads on the single-ended side and on the differential side, efficient energy transfer from the transmitter section to the antenna via the transformer balun, and complexity of implementation.

Therefore, a need exists for a tuned transformer balun circuit that provides for efficient energy transfer from the transmitter section to the antenna and provides enhanced impedance matching.

BRIEF SUMMARY OF THE INVENTION

The tuned transformer balun circuit of the present invention substantially meets these needs and others. In one embodiment, a tuned transformer balun circuit includes a transformer balun, a first tuning capacitor, a second tuning capacitor, and a third tuning capacitor. The transformer balun has a single-ended winding and a differential winding, wherein the single-ended winding includes a first node and a second node and the differential winding includes a first node, a center node, and a second node. The first tuning capacitor has a first plate and a second plate, wherein the first plate of the first tuning capacitor is operably coupled to the first node of the differential winding and the second plate of the first tuning capacitor is operably coupled to a circuit ground. The second tuning capacitor has a first plate and a second plate, wherein the first plate of the tuning capacitor is operably coupled to the second node of the differential winding and the second plate of the second tuning capacitor is operably coupled to the circuit ground. The third tuning capacitor has a first plate and a second plate, wherein the first plate of the third tuning capacitor is operably coupled to the first node of the single-end winding and the second plate of the third tuning capacitor is operably coupled to transceiver radio frequency signals, wherein, based on loading of the single-ended winding and the differential winding, the first, second, and third tuning capacitors resonate with the transformer balun to provide efficient energy transfer from the transmitter section to the antenna.

DETAILED DESCRIPTION OF THE INVENTION

Figure 1:
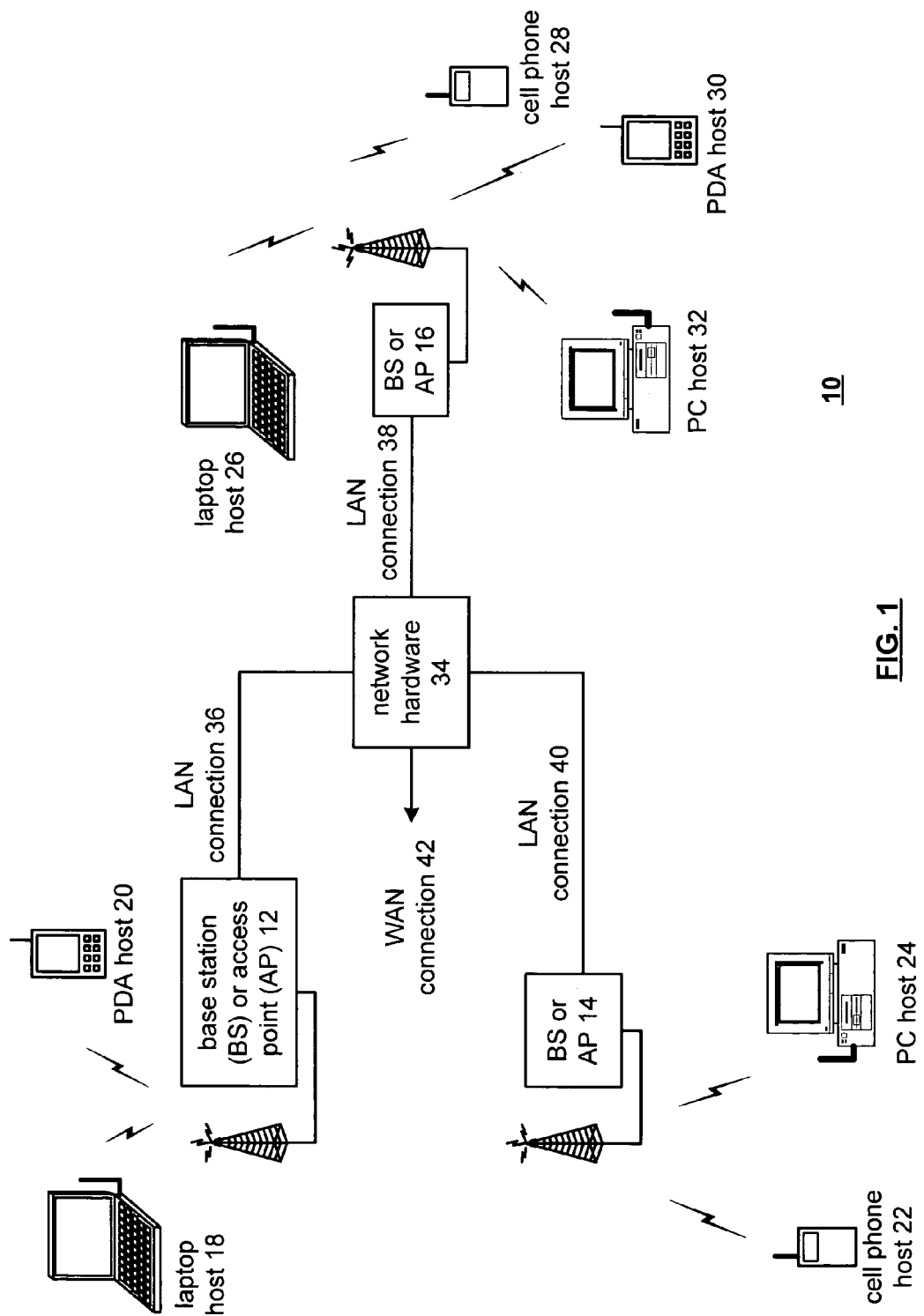
FIG. 1 is a schematic block diagram of a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
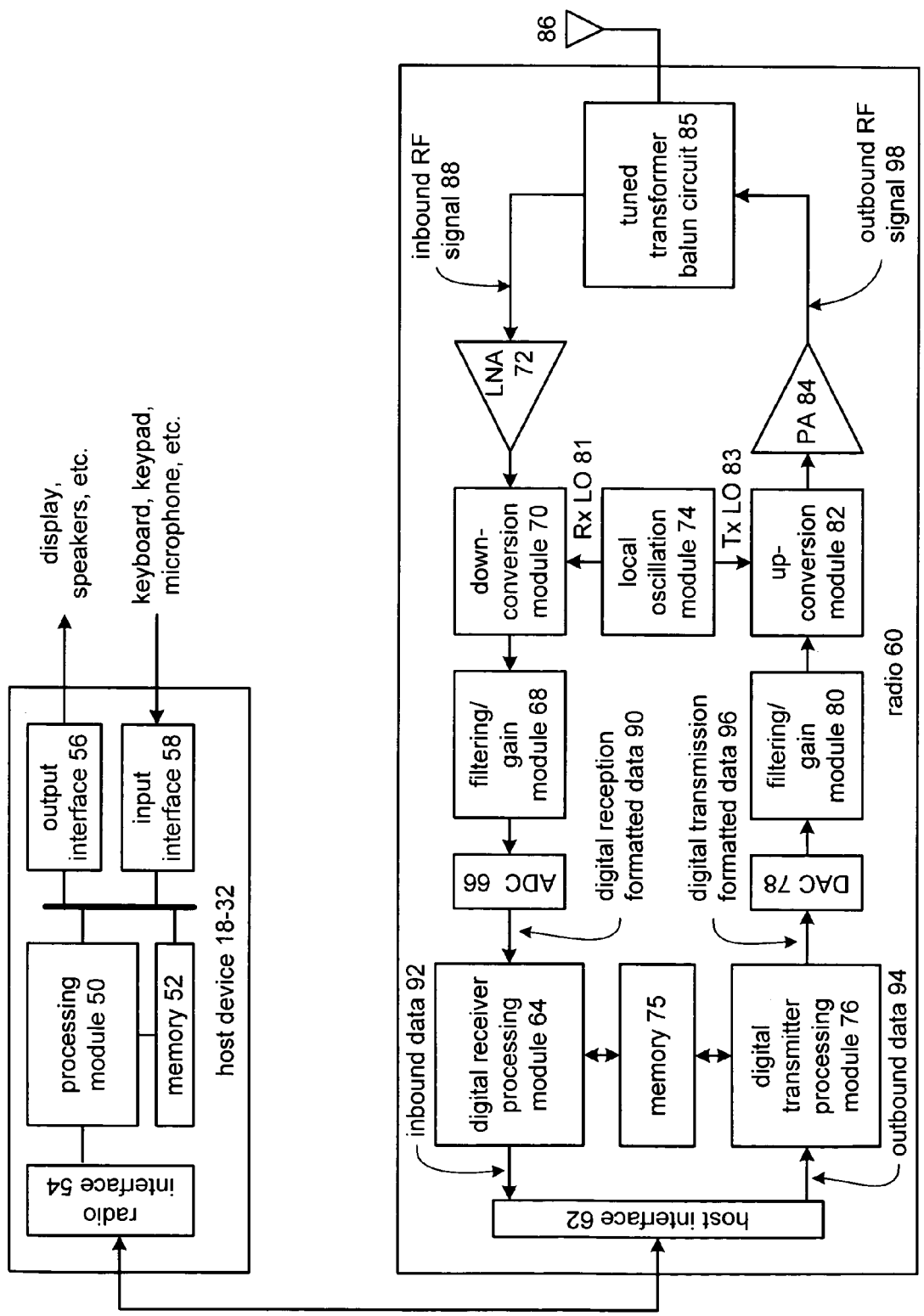
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/gain module 68, an IF mixing down conversion stage 70, a low noise amplifier 72, a tuned transformer balun circuit 85, a local oscillation module 74, memory 75, a digital transmitter processing module 76, a digital-to-analog converter 78, a filtering/gain module 80, an IF mixing up conversion stage 82, a power amplifier 84, and an antenna 86. The antenna 86 is shared by the transmit and receive paths via the tuned transformer balun circuit 85, which will be described in greater detail with reference to FIGS. 3 and 4.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11 Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 converts the analog baseband or low IF signal into an RF signal based on a transmitter local oscillation 83 provided by local oscillation module 74. The power amplifier 84 amplifies the RF signal to produce outbound RF signal 98, which is provide to the antenna 86 via the tuned transformer balun circuit 85, where the antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the low noise amplifier 72 via the tuned transformer balun circuit 85. The low noise amplifier 72 amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
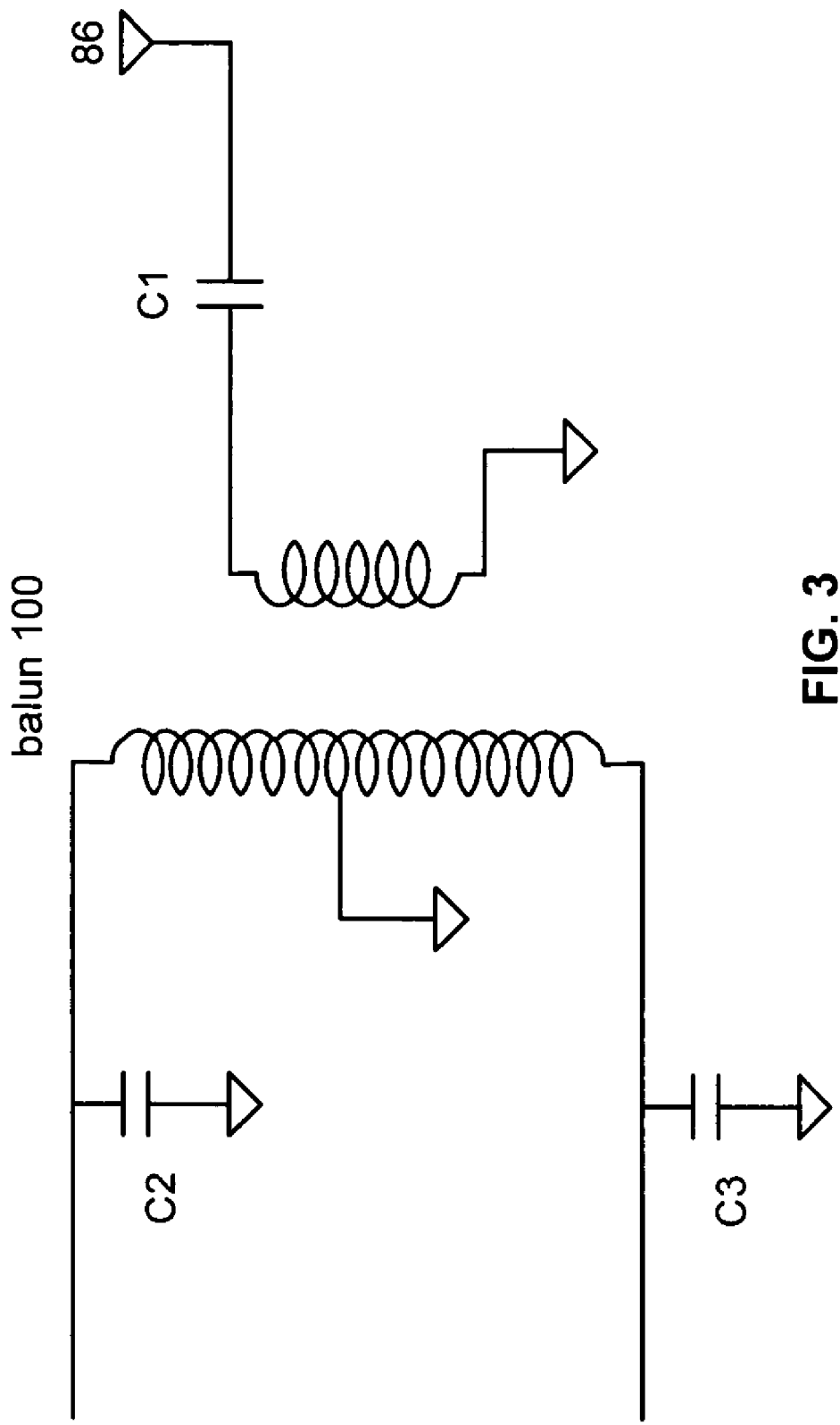
FIG. 3 is a schematic block diagram of a tuned transformer balun circuit in accordance with the present invention.

FIG. 3 is a schematic block diagram of a tuned transformer balun circuit 85 that includes a transformer balun 100, a $1^{st}$ capacitor C1, a $2^{nd}$ capacitor C2, and a $3^{rd}$ capacitor C3. The transformer balun 100 includes a single-ended winding and a differential winding. The single-ended winding is coupled to antenna 86 via capacitor C1. The differential winding is coupled to the power amplifier 84 and to the low noise amplifier 72. The antenna 86, power amplifier 84 and low noise amplifier 72 provide a load on the transformer balun 100. To provide efficient energy transfer while in the transmit mode, capacitor C1, C2 and C3 are tuned to resonant with the inductance of the transformer balun 100 taking into account the loading provided by antenna 86 and the loading provided by the power amplifier 84 and low noise amplifier 72. In one embodiment, the inductance of the transformer may be in the neighborhood of a few tenths of nano-henries to nano-henries and the capacitance value of each capacitor C1, C2 and C3 may be in the range of tens of femto-farads to pico-farads.

As one of average skill in the art will appreciate, by tuning the impedance on the single-ended winding via capacitor C1 and tuning the impedance on the differential winding via capacitor C2 and C3, the impedance on the single-ended side may substantially match the impedance on the differential side thereby enabling more efficient energy transfer while in the transmit mode.

Figure 4:
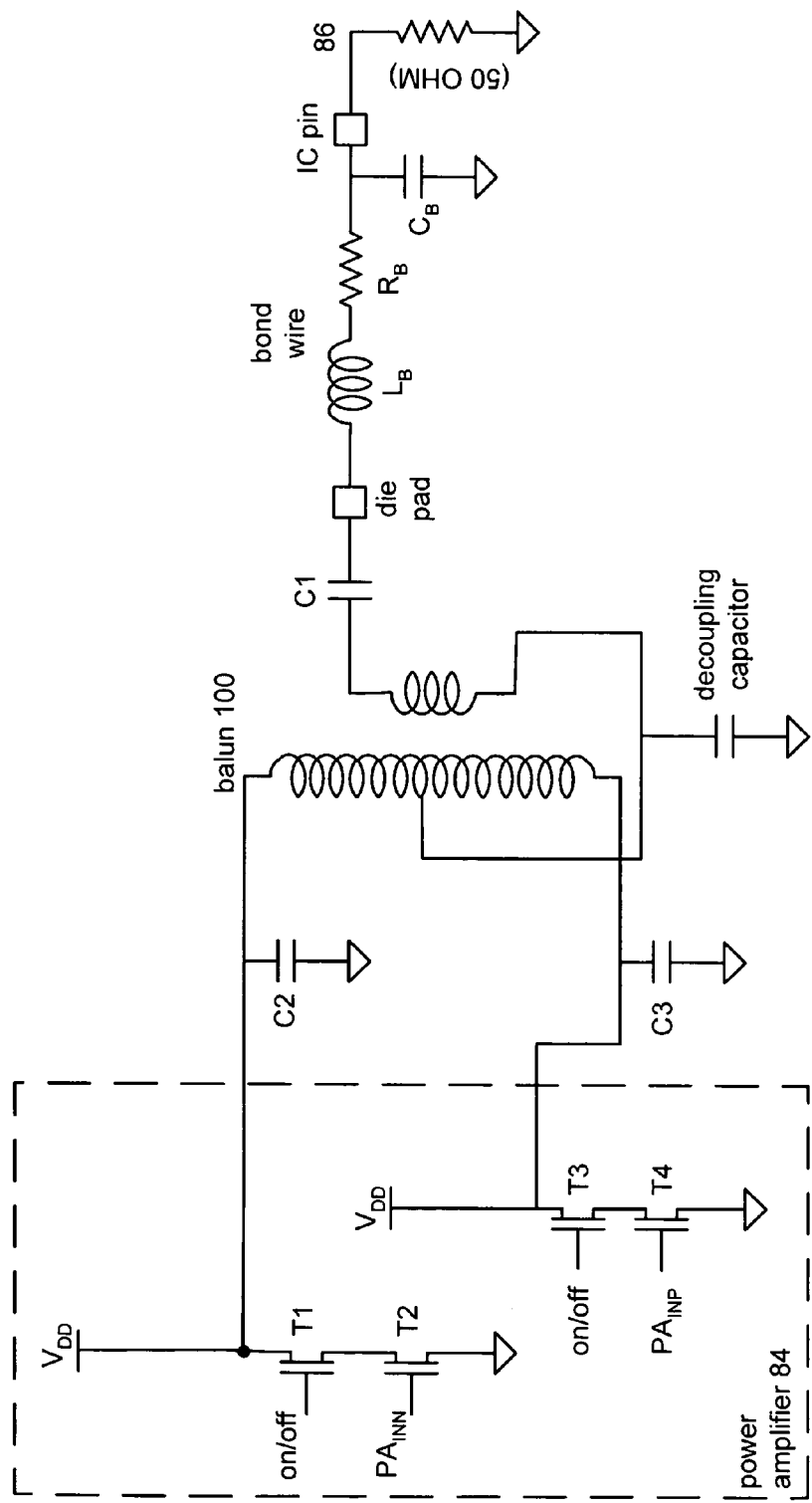
FIG. 4 is a schematic block diagram of another tuned transformer balun circuit in accordance with the present invention.

FIG. 4 is a schematic block diagram of another embodiment of a tuned transformer balun circuit 85. In this embodiment, the circuit 85 includes the transformer balun 100, capacitor C1, C2, and C3 and a decoupling capacitor. The transformer balun circuit 85 is implemented on an integrated circuit die. The single-ended winding of transformer balun 100 is coupled to a die pad via capacitor C1. The die pad is coupled to an integrated circuit pin via a bond wire that includes an inductance component $L_B$, a resistive component $R_B$ and a capacitive component $C_B$. The integrated circuit pin is coupled to an antenna which in this illustration is shown as a resistor having a value of 50 OHMS.

The differential winding of transformer balun is coupled to power amplifier 84, which is shown to include inductors L1, L2, output capacitors $C_{OUT1}$ and $C_{OUT2}$, cascade transistors T1 and T3 and input transistors T2 and T4. With the loading provided by the antenna 86, the bond wire and the power amplifier 84, the capacitance values of C1, C2 and C3 may be selected. The capacitance value of the decoupling capacitor is selected such that at radio frequencies, the decoupling capacitor appears to function as a low impedance thereby providing an AC ground for the transformer balun 100. Note that the transistors within power amplifier 84 include parasitic components which can readily be determined based on the geometry of the corresponding transistors. As such, when the capacitance values for C1, C2 and C3 are determined, the parasitic capacitances of the transistors T1–T4 of power amplifier 84 are factors in such a determination. Accordingly, depending on the frequency of operation, the inductance of the transformer may be in the neighborhood of a few tenths of nano-henries to nano-henries and the capacitance value of each capacitor C1, C2 and C3 and the decoupling capacitor may be in the range of tens of femto-farads to pico-farads.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a tuned transformer balun circuit that provides efficient energy transfer from a transmitter section to an antenna. As one of average skill in the art will appreciate, other embodiments may be derived from the teaching of the present invention without deviating from the scope of the claims.

What is claimed is:

1. A tuned transformer balun circuit comprises:
   a transformer balun having a single-ended winding and a differential winding, wherein the single-ended winding includes a first node and a second node and the differential winding includes a first node, a center node, and a second node;
   a first tuning capacitor having a first plate and a second plate, wherein the first plate of the first tuning capacitor is coupled to the first node of the differential winding and the second plate of the first tuning capacitor is connected directly to a circuit ground;
   a second tuning capacitor having a first plate and a second plate, wherein the first plate of the tuning capacitor is coupled to the second node of the differential winding and the second plate of the second tuning capacitor is connected directly to a circuit ground;
   a third tuning capacitor having a first plate and a second plate, wherein the first plate of the third tuning capacitor is coupled to the first node of the single-end winding and the second plate of the third tuning capacitor is coupled to transceiver radio frequency signals, wherein based on loading of the single-ended winding and the differential winding, the first, second, and third tuning capacitors resonate with the transformer balun; and
   a decoupling capacitor having a first plate and a second plate, wherein the first plate of the decoupling capacitor is coupled to the second node of the single-ended winding and to the center node of the differential winding and the second plate of the decoupling capacitor is coupled to the circuit ground to provide a low impedance AC ground connection over a range of frequencies.

2. The tuned transformer balun circuit of claim 1, wherein the first, second, and third capacitors have a capacitance in the range of a tens of femto-Farads to tens of pico-Farads.

3. The tuned transformer balun circuit of claim 1 further comprises:
   the transformer balun residing on at least one layer of an integrated circuit, wherein the second node of the single-ended winding is coupled to an integrated circuit pin via a bond wire and wherein the integrated circuit pin is coupled to an antenna, wherein the bond wire and the antenna provide the loading of the single-ended winding.

4. The tuned transformer balun circuit of claim 3 further comprises:
   the first node of the differential winding coupled to a first output transistor of a power amplifier, wherein the first output transistor includes parasitic capacitance; and
   the second node of the differential winding coupled to a second output transistor of the power amplifier, wherein the second output transistor includes parasitic capacitance, wherein the first and second output transistors of the power amplifier provide the loading of the differential winding.

5. A radio frequency integrated circuit (RFIC) comprises:
   a receiver section operably coupled to convert inbound radio frequency (RF) signals into inbound data;
   a transmitter section operably coupled to convert outbound data into outbound RF signals; and
   a tuned transformer balun circuit operably coupled to provide the inbound RF signals from an antenna to the receiver section and to provide the outbound RF signals to the antenna, wherein the tuned transformer balun circuit includes:
   a transformer balun having a single-ended winding and a differential winding, wherein the single-ended winding includes a first node and a second node and the differential winding includes a first node, a center node, and a second node;
   a first tuning capacitor having a first plate and a second plate, wherein the first plate of the first tuning capacitor is coupled to the first node of the differential winding and the second plate of the first tuning capacitor is connected directly to a circuit ground;
   a second tuning capacitor having a first plate and a second plate, wherein the first plate of the tuning capacitor is coupled to the second node of the differential winding and the second plate of the second tuning capacitor is connected directly to a circuit ground;
   a third tuning capacitor having a first plate and a second plate, wherein the first plate of the third tuning capacitor is coupled to the first node of the single-end winding and the second plate of the third tuning capacitor is coupled to transceiver radio frequency signals, wherein based on loading of the single-ended winding and the differential winding, the first, second, and third tuning capacitors resonate with the transformer balun; and
   a decoupling capacitor having a first plate and a second plate, wherein the first plate of the decoupling capacitor is coupled to the second node of the single-ended winding and to the center node of the differential winding and the second plate of the decoupling capacitor is coupled to the circuit ground to provide a low impedance AC ground connection over a range of frequencies.

6. The RFIC of claim 5, wherein the first, second, and third capacitors have a capacitance in the range of a tens of femto-Farads to tens of pico-Farads.

7. The RFIC of claim 5, wherein the tuned transformer balun circuit further comprises:
   the transformer balun residing on at least one layer of an integrated circuit supporting the RFIC, wherein the second node of the single-ended winding is coupled to an integrated circuit pin via a bond wire and wherein the integrated circuit pin is coupled to an antenna, wherein the bond wire and the antenna provide the loading of the single-ended winding.

8. The RFIC of claim 7 further comprises:
   the first node of the differential winding coupled to a first output transistor of a power amplifier, wherein the first output transistor includes parasitic capacitance; and
   the second node of the differential winding coupled to a second output transistor of the power amplifier, wherein the second output transistor includes parasitic capacitance, wherein the first and second output transistors of the power amplifier provide the loading of the differential winding.

* * * * *